United States Patent
Frede

(10) Patent No.: US 10,768,263 B2
(45) Date of Patent: Sep. 8, 2020

(54) TEST AND MEASUREMENT DEVICE AND OPERATING METHOD

(71) Applicant: Rohde & Schwarz GmbH & Co. KG, Munich (DE)

(72) Inventor: Tobias Frede, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 182 days.

(21) Appl. No.: 15/833,163

(22) Filed: Dec. 6, 2017

(65) Prior Publication Data

US 2018/0275241 A1    Sep. 27, 2018

(30) Foreign Application Priority Data

Mar. 23, 2017   (EP) ..................................... 17162484

(51) Int. Cl.
| | |
|---|---|
| *G01R 13/02* | (2006.01) |
| *G06F 13/00* | (2006.01) |
| *G01R 35/00* | (2006.01) |
| *G01R 13/06* | (2006.01) |
| *G01R 31/319* | (2006.01) |

(52) U.S. Cl.
CPC ........... *G01R 35/005* (2013.01); *G01R 13/02* (2013.01); *G01R 13/06* (2013.01); *G01R 31/31908* (2013.01)

(58) Field of Classification Search
CPC ............ G01R 31/319; G01R 31/31908; G01R 31/2863; G01R 31/2889; G01R 35/005; G01R 35/007; G06F 11/22; G06F 11/3688; G06F 19/00
See application file for complete search history.

(56) References Cited

U.S. PATENT DOCUMENTS

| | | | | |
|---|---|---|---|---|
| 5,861,882 | A * | 1/1999 | Sprenger | ................ G01R 1/025 700/83 |
| 6,064,372 | A * | 5/2000 | Kahkoska | ............. G06F 1/1601 345/173 |
| 9,785,542 | B2 * | 10/2017 | Elston | ................. G06F 11/3688 |
| 2003/0212522 | A1 * | 11/2003 | Sutton | ................ G01R 19/2516 702/117 |
| 2004/0267470 | A1 * | 12/2004 | Fender | ................... G01R 1/025 702/67 |
| 2005/0185769 | A1 * | 8/2005 | Pickerd | ................ G01R 35/005 379/30 |
| 2007/0273389 | A1 | 11/2007 | Tan et al. | |
| 2009/0003502 | A1 | 1/2009 | Campiche et al. | |
| 2013/0326299 | A1 | 12/2013 | Oshima | |
| 2016/0216295 | A1 | 7/2016 | Knierim et al. | |

OTHER PUBLICATIONS

Extended European Search Report for European Patent Application No. 17162484.4, dated Sep. 11, 2017, 7 pages.

* cited by examiner

*Primary Examiner* — Minh N Tang
(74) *Attorney, Agent, or Firm* — Westman, Champlin & Koehler, P.A.

(57) ABSTRACT

A test and measurement device for testing an electronic device under test comprises a test controller, which is configured to control the test and measurement device to perform tests with the electronic device under test based on respective user provided configuration parameters, and a memory device, which is coupled to the test controller, wherein the test controller is configured to automatically store for every test in the memory device a parameter set comprising the user provided parameters.

16 Claims, 4 Drawing Sheets

TEST AND MEASUREMENT DEVICE AND OPERATING METHOD

CROSS-REFERENCE TO RELATED APPLICATION(S)

This application claims priority to European Patent Application No. 17162484.4, filed on Mar. 23, 2017, the content of which are hereby incorporated by reference in its entirety.

TECHNICAL FIELD

The present invention relates to a test and measurement device. The present invention further relates to a respective operating method for operating a test and measurement device.

BACKGROUND

Although applicable in principal to any test or measurement system, the present invention and its underlying problem will be hereinafter described in combination with oscilloscopes.

Modern oscilloscopes allow users to adapt a variety of different configuration parameters of the oscilloscope according to the respective measurement task.

A user may therefore configure the oscilloscope for every single measurement task. Further, users may manually store configurations of oscilloscopes and manually retrieve the stored configurations.

Against this background, the problem addressed by the present invention is providing an improved management of oscilloscope configurations.

SUMMARY

The present invention solves this object by a test and measurement device and by an operating method for operating a test and measurement device.

Accordingly it is provided:

A test and measurement device for testing an electronic device under test, the test and measurement device comprising a test controller, which is configured to control the test and measurement device to perform tests with the electronic device under test based on respective user provided configuration parameters, and a memory device, which is coupled to the test controller, wherein the test controller is configured to automatically store for every test in the memory device a parameter set comprising the user provided configuration parameters.

Further it is Provided:

An operating method for operating a test and measurement device, the method comprising receiving user provided configuration parameters for tests with the electronic device under test, performing the tests with the electronic device under test based on the received user provided configuration parameters, and automatically storing for every test a parameter set comprising the user provided configuration parameters.

The present invention is based on the finding that it is cumbersome for a user to manually create and store configurations in an oscilloscope.

The present invention therefore provides a test and measurement device that performs an automatic management of the different user provided configurations.

Usually prior to performing a test a user will set up the test, i.e. configure the test and measurement device according to his needs.

Now, instead of waiting for the user to tell the test controller to store a set of configuration parameters, in the present invention the test controller will automatically store sets of user provided configuration parameters in the memory device for every user initiated test.

The memory device will therefore contain the configurations or sets of configuration parameters for the tests that have already been performed with the test and measurement device. It is understood, that the test controller may verify if any parameter changes occurred between two tests. If no parameter was changed, the test controller may skip the second test and not store a new parameter set.

The test and measurement device of the present invention therefore allows easily restoring any configuration of the test and measurement device that a user may have used before without any need to explicitly store or save configurations.

Further embodiments of the present invention are subject of the further subclaims and of the following description, referring to the drawings.

In a possible embodiment the test controller may be configured to store together with the user provided configuration parameters an image of at least one measurement curve that was recorded during the respective test.

If the settings or parameters provided by the user are automatically stored, they can e.g. be labelled by the test controller with a date and time to make them distinguishable. However, simple date and time labels may be hard to search and identify, especially with a high number of such labels when a user is looking for a specific test configuration.

Storing an image of a measurement curve, e.g. a screen shot of the display of the test and measurement device after the curve was recorded, can provide visual labels for the sets of configuration parameters. Therefore, instead of or together with a list of labels, the images may be presented to a user who may then select the respective test configuration based on the respective image.

Further, a user may provide labels for the single parameter sets, e.g. via a keyboard, on screen or hardware, or via any other input.

In a possible embodiment the test and measurement device may comprise a display device that is configured to display a representation of the stored parameter sets. Further, the test and measurement device may comprise a user input device that is configured to receive a user selection of one of the displayed representations, wherein the test controller may be configured to load a respective set of user provided configuration parameters based on the user selection.

The representation may, as already indicated above, comprise a date and time label for the respective parameter set. Further, the representation may also comprise the stored image for the respective parameter set alone or in combination with the date and time label.

The user input may e.g. comprise hardware inputs, like e.g. push buttons, dials and switches. The user input may in addition or as alternative comprise a touch screen device, e.g. included in the display device, of the test and measurement device.

After a user selects one of the parameter sets, e.g. by selecting the respective image on a (touch-)screen, the test controller may load the respective parameters to configure the test and measurement device.

In a possible embodiment the test controller may be configured to store measurement results of a measurement together with the respective parameter set and is further configured to dynamically generate the representation of the respective parameter set based on the measurement results.

The test controller may e.g. generate a measurement curve based on the stored measurement results as it generated the original measurement curve during the first execution of the respective test.

In a possible embodiment the test and measurement device may comprise a tabbed interface that is displayed on the display device, wherein every tab of the tabbed interface may comprise one of the representations of the stored parameter sets.

In the tabbed interface every tab may comprise e.g. the image for the respective parameter set. In addition e.g. a short list of the most relevant parameters of the parameter set may be displayed.

Therefore, by simply choosing one of the tabs, a user may quickly gain an overview over the respective parameter set.

In a possible embodiment when a tab is selected the test controller may be configured to automatically load the respective parameter set and configure the test and measurement device according to the loaded parameter set.

The automatic loading of parameter sets with a simple selection of a tab allows to quickly configure the test and measurement device during operation. Further, a quick switching between the different parameter sets is possible by simply switching between different tabs.

Other types of shortcuts to the parameter sets are also possible. Such shortcuts may comprise hardware buttons and dials or on screen buttons.

In a possible embodiment the tabbed interface may comprise in every one of the tabs a fully operational display of the test and measurement device.

A fully operational display refers to the display of the test and measurement device as it is usually presented to a user during normal operation of the test and measurement device.

Therefore, by switching between the tabs the user may not only be informed about a specific parameter set. Instead the test and measurement device will be put into the same state as during the measurement and the user may start using the test and measurement device exactly as during the measurement when it was performed for the first time.

In a possible embodiment the test and measurement device may comprise a new parameter set user input, wherein the test controller may be configured to create a new parameter set after the new parameter set input is selected and store any parameter that is set by a user in a new parameter set.

The new parameter set input may e.g. be a new tab function input that may be a last tab indicator in the tabbed interface. The test controller may e.g. create a new tab when the new tab function input is selected and store any parameter set by a user in the newly created tab in a new parameter set.

The new parameter set input may also comprise any other type of input, like e.g. hardware or on screen buttons.

With the new parameter set input the user may directly inform the test controller that a new parameter set should be initiated and that the following inputs should be regarded as parameters of the newly created parameter set.

It is therefore not necessary to perform a test for the parameter set to be automatically stored by the test controller.

In a possible embodiment the test controller may be configured to delete the oldest parameter set from the memory device and store a new parameter set in the memory device, when the capacity of the memory device is depleted.

The memory device can be seen as a kind of first input first output (or deleted) memory device with a predefined capacity. It is understood that in this context the term memory device not only refers to a dedicated hardware memory device. The memory device can e.g. also be a data structure or file that is stored in RAM or on a hard disk.

In a possible embodiment the test and measurement device may comprise a marking user input configured to receive a user input regarding a respective parameter set, wherein the test controller may be configured to mark the respective parameter set as permanent after receiving the user input and when deleting the oldest parameter set from the memory device skipping the parameter sets marked as permanent.

This allows a user to preserve important configurations even if the capacity of the memory device is depleted. Further, the test controller may show the parameter sets marked as permanent first when showing all parameter sets to the user.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
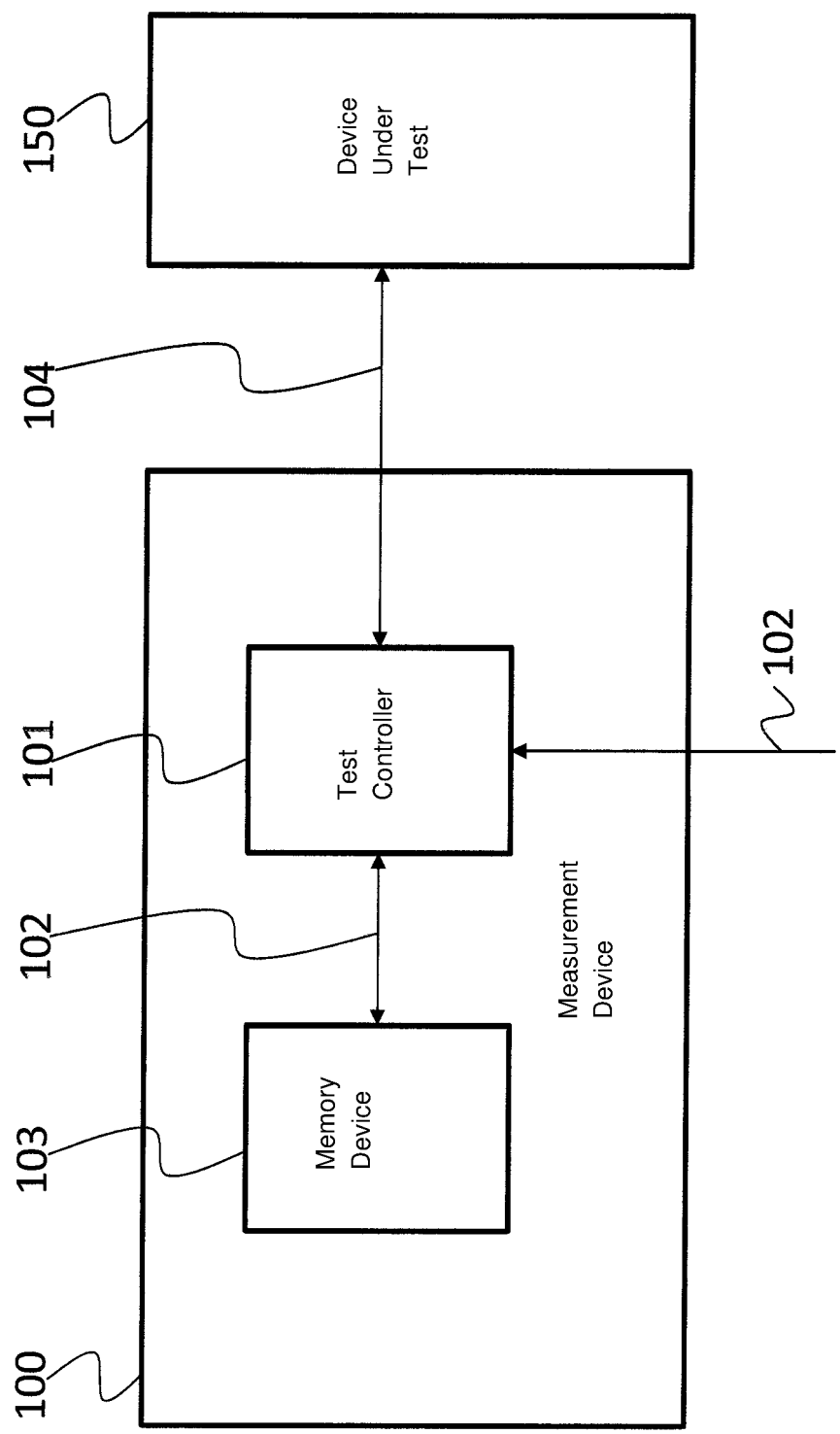
FIG. 1 shows a block diagram of an embodiment of a test and measurement device according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a test and measurement device 100 for testing an electronic device under test 150. The measurement device 100 may e.g. be an oscilloscope or a vector network tester or any other type of test or measurement equipment.

The measurement device 100 comprises a test controller 101 that is coupled to a memory device 103. Further, the test controller 101 receives configuration parameters 102, e.g. from a user. Although not explicitly shown it is understood that the measurement device 100 may comprise any other elements that are necessary to perform tests and/or measurements with the device under test 150. Such elements may e.g. be power supplies, oscillators, signal generators, amplifiers, attenuators, filters, analog-to-digital converters or the like. The memory device 103 may be any kind of memory, like e.g. a RAM, EEPROM, Hard disk, solid state drive, USB drive, SD-card, or even a remote network storage. Especially in case of a non-volatile memory, it is obvious that the below described functionality will also be available after a reboot of the measurement device 100.

The test controller 101 may be the central control unit of the measurement device 100 and control all elements of the measurement device 100, e.g. control signal generators to generate test signals 104 that may be transmitted to the device under test 150 or control analog-to-digital converters to record test signals 104 from the device under test 150. The test controller 101 may further perform the evaluation of the recorded test signals 104 and provide respective user feedback. The test controller 101 may e.g. comprise a processing unit, a microcontroller, a CPLD, FPGA, ASIC and/or any other type of programmable logic device.

Prior to performing any measurement or test with the device under test 150 a user may provide the test controller 101 with configuration parameters 102 for the respective test. Usually a user will provide such configuration parameters 102 for every test that he needs to perform.

After receiving a set of configuration parameters 102 a user may e.g. start a test with the measurement device 100. The test controller 101 will then store the configuration parameters 102 in the memory device 103 automatically such that the configuration parameters 102 may later be retrieved by the user and reused in further test.

By automatically storing the configuration parameters 102 of the single tests performed with the measurement device 100, the test controller 101 provides an automatic management of configuration parameters 102 and no manual intervention is necessary from a user.

Figure 2:
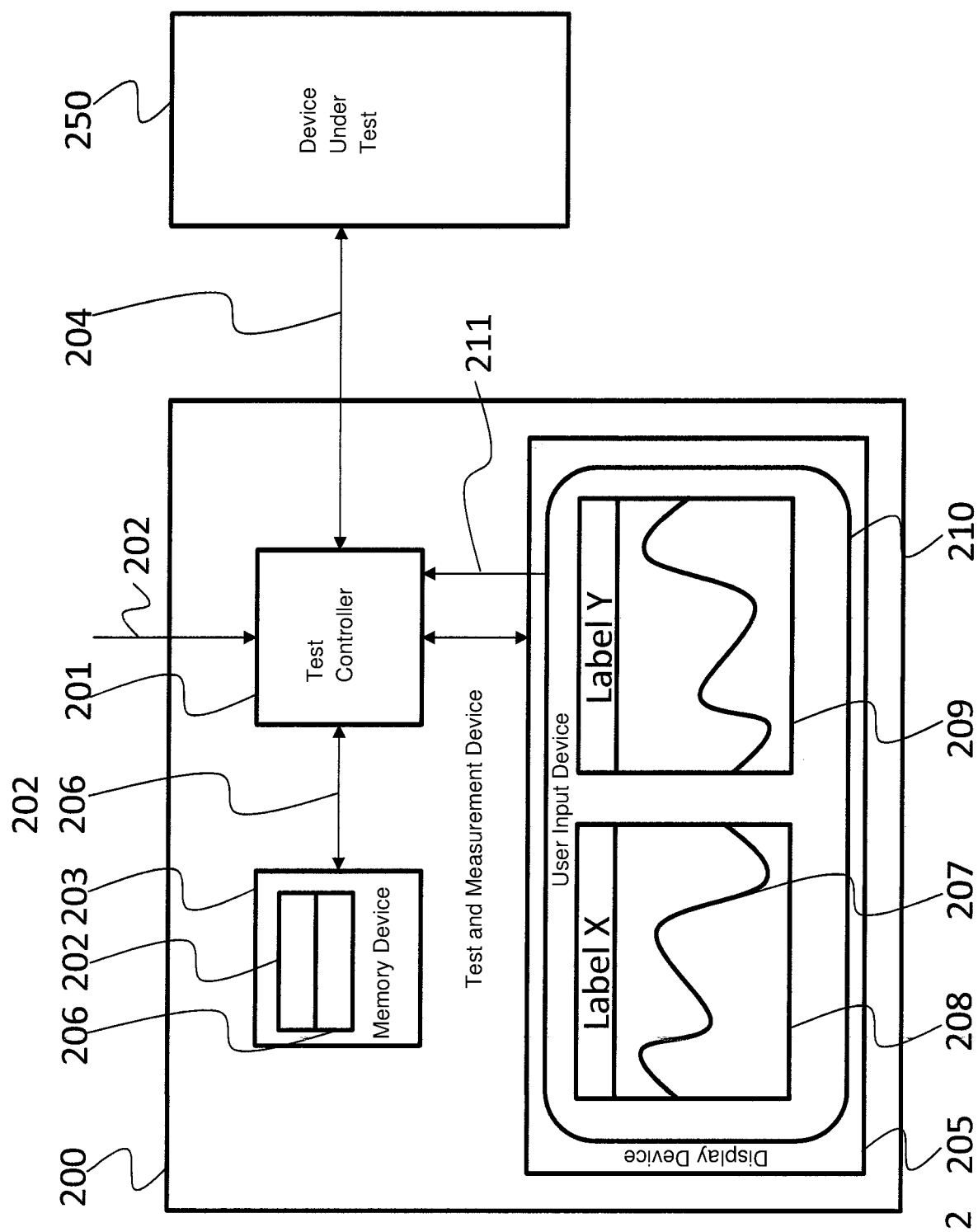
FIG. 2 shows a block diagram of another embodiment of a test and measurement device according to the present invention.

FIG. 2 shows a block diagram of another test and measurement device 200. The test and measurement device 200 is based on the test and measurement device 100 and comprises a display device 205 that is coupled to the test controller 201. Further, the test controller 201 stores in the memory device 203 not only the configuration parameters 202 but also an image 206 that represents the respective parameter set of configuration parameters 202. The display device 205 may e.g. be a LCD screen of the test and measurement device 200.

The image 206 may e.g. show a measurement curve 207 that was recorded during the test that was the basis for the respective parameter set. Alternatively the image 206 may show a screenshot of the complete content of the display device 205 as it was shown during the test.

A user may now activate a parameter set selection process, e.g. via a user input that is not separately shown. After the user activates this selection process, the test controller 201 may load the parameter sets of configuration parameters 202 together with the corresponding images 206 and provide the user with a representation 208, 209 of the respective parameter sets.

In the display device 205 two representations 208, 209, one labeled with "Label X" and one labeled with "Label Y", are shown. The labels may e.g. be user-provided or derived from the configuration parameters 202. Further, the labels may e.g. be derived of any labels that the user may provide for the test that is the basis for the configuration parameters 202 and the image 206, e.g. axis labels.

Although not explicitly shown, it is understood, that any type of user input, e.g. push buttons, may be provided that allows the user to scroll through a list of representations 208, 209 if there exist more than two representations. Further, a user input may be provided that allows the user zooming or scaling the representations. A user may e.g. choose to show only one representation 208, 209 on the display device 205 at a time. The single representations 208, 209 may then be switched like windows on a graphical operating system when the user presses forward or back buttons. The user may also choose to show three or four or more representations 208, 209 on the display device 205.

The display device 205 further comprises in this embodiment a user input device 210 in the form of a touch screen. The touch screen 210 may forward a user selection 211 to the test controller 201. The test controller 201 will then load the respective configuration parameters 202 from the memory device 203 and configure the test and measurement device 200 accordingly.

Configuring in this context may also include that the full state including the measurement values and the displayed content in the display device 205 may be restored. In this case the necessary data would be stored together with the configuration parameters 202 and the image 206.

Figure 3:
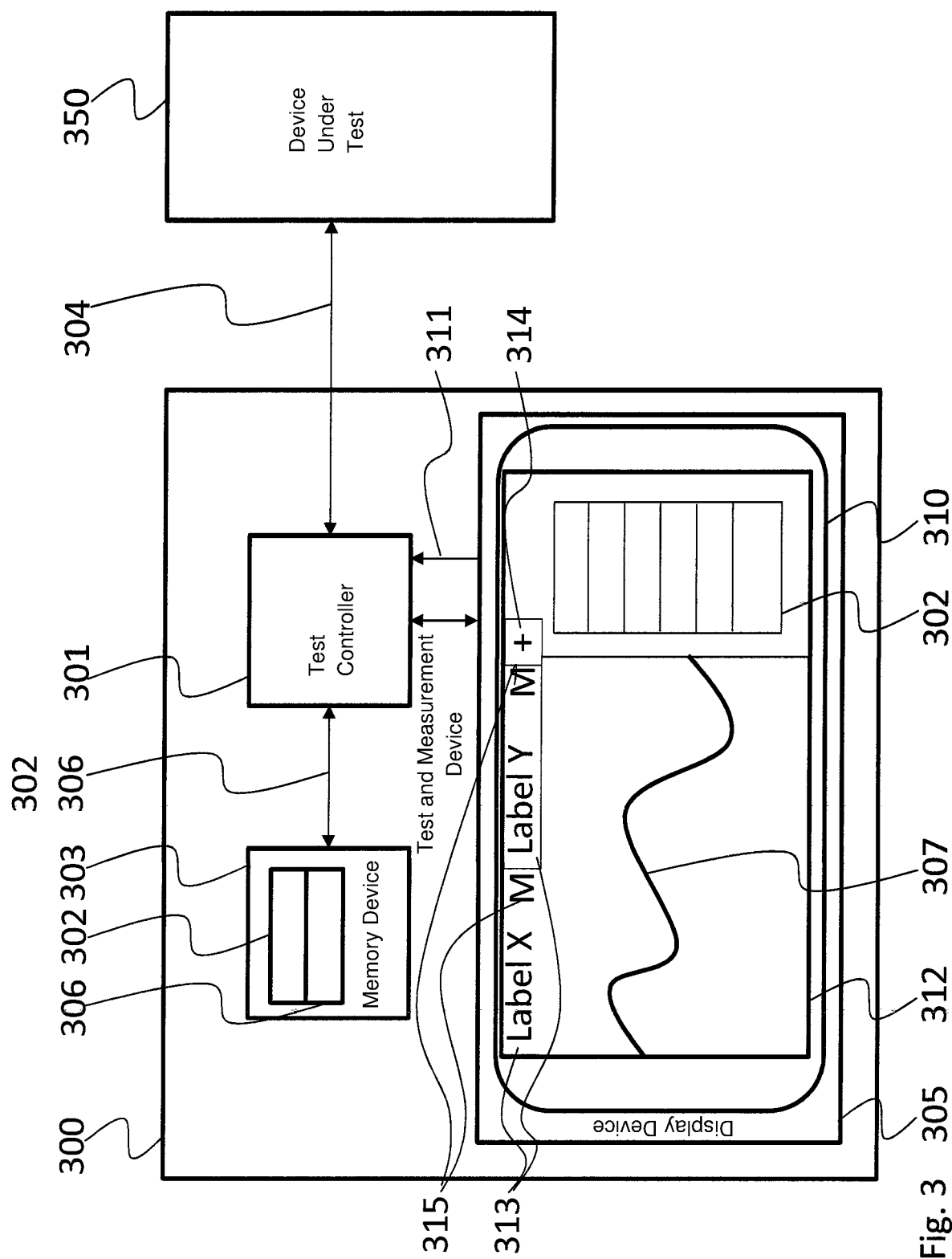
FIG. 3 shows a block diagram of another embodiment of a test and measurement device according to the present invention.

FIG. 3 shows a block diagram of a test and measurement device 300. The test and measurement device 300 is based on the test and measurement device 200 and also comprises a test controller 301, a memory device 303 and a display device 305 with a touch screen 310.

The test and measurement device 300 comprises a tabbed interface 312 that is displayed on the display device 305. Tabbed in this context refers to the organization of different test setups or configurations of the test and measurement device 300 in tabs. Tabs may comprise a large content section and a small header section that e.g. comprises a label for the tab. In FIG. 3 two tabs 313 are shown, one labeled "Label X" and the other labeled "Label Y".

The display device 305 may show a representation of a parameter set of configuration parameters 302 when the user selects one of the tabs 313. However, the test controller 301 may also be configured to manage different configurations of the test and measurement device 300 in parallel or load a complete configuration for the test and measurement device 300 as soon as a tab is selected by the user.

This means that a user can switch between totally different configurations of the test and measurement device 300 with a single selection of a tab 313. With the quick switching capabilities the test and measurement device 300 can be used like two or more separate test and measurement devices 300, by a user who does not need to provide several test and measurement devices 300 to work efficiently and consecutively perform different tests on a device under test 350.

The tabbed interface 312 provides two further user inputs 314 and 315. The new parameter set user input 314 allows a user to open a new tab in the tabbed interface 312. The new tab may represent a configuration of the test and measurement device 300 that may e.g. be preloaded with standard configuration values as a starting point. The user may then perform the configuration that he requires for a measurement and the test controller 301 will automatically store the configuration parameters 302 even if the user did not start a test.

Finally, the tab headers comprise a marking user input 315 that serves to mark a tab and the respective configuration parameters 302 and image 306 as permanent.

The memory device 303 may have a limited capacity. This means that eventually the test controller 301 will have to automatically remove configuration parameters 302 and images 306 when the capacity of the memory device 303 is depleted. The test controller 301 may adopt a first input—first deleted scheme, where the oldest parameter sets, i.e. configuration parameters 302 with the respective image 306, are deleted first.

However, independently of the age of a parameter set a parameter set may be particularly important to a user. The user may therefore mark such a parameter set as "permanent", which will prevent the test controller 301 from deleting the respective parameter set.

For sake of clarity in the following description of the method based FIG. 4 the reference signs used above in the description of apparatus based FIGS. 1-3 will be maintained.

Figure 4:
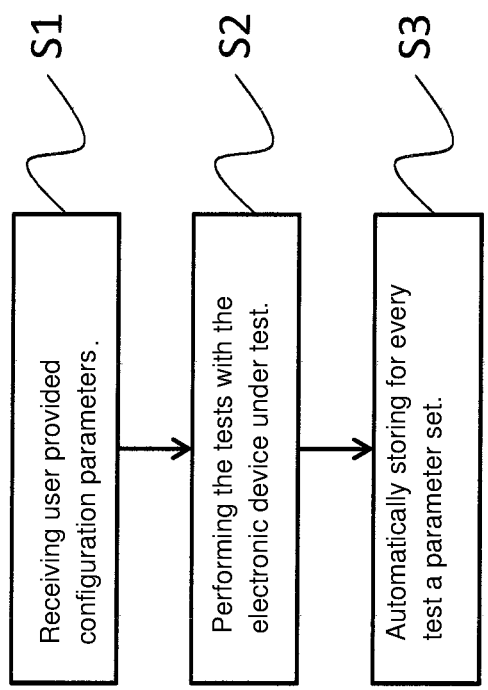
FIG. 4 shows a flow diagram of an embodiment of an operating method according to the present invention.

FIG. 4 shows a flow diagram of an operating method for operating a test and measurement device 100, 200, 300.

The method comprises receiving S1 user provided configuration parameters 102, 202, 302 for tests with the electronic device under test 150, 250, 350 and performing S2 the tests with the electronic device under test 150, 250, 350 based on the received user provided configuration parameters 102, 202, 302. Further, the method comprises automatically storing S3 for every test a parameter set comprising the user provided configuration parameters 102, 202, 302.

Storing S3 may comprise storing together with the user provided configuration parameters 102, 202, 302 an image 206, 306 of at least one measurement curve 207, 307 that was recorded during the respective test. The measurement curve 207, 307 may e.g. be embedded in a screen shot of a display device of the test and measurement device 100, 200, 300. Instead of an image 206, 306 measurement results of a measurement may be stored together with the respective parameter set and the representation 208, 209 may be dynamically generated for the respective parameter set based on the measurement results.

To simplify the selection of the stored configuration parameters 102, 202, 302 a representation 208, 209 of the stored parameter sets may be displayed and a user selection 211, 311 may be received for one of the displayed representations 208, 209. After the user selection 211, 311 is received, the respective set of user provided configuration parameters 102, 202, 302 is loaded based on the user selection 211, 311.

The representations 208, 209 may also be displayed in a tabbed interface 312, wherein every tab 313 of the tabbed interface 312 comprises one of the representations 208, 209 of the stored parameter sets.

With the tabbed interface 312 when a tab 313 is selected the respective parameter set may be automatically loaded and the test and measurement device 100, 200, 300 may be configured according to the loaded parameter set.

In addition, the tabbed interface 312 may comprise in every one of the tabs 313 a fully operational display of the test and measurement device 100, 200, 300.

New parameter sets may be created after receiving a new parameter set input from a user and the respective parameters that are set by a user in the newly created parameter set may be stored, even without any test being performed.

The memory that holds the parameter sets has a limited capacity. Therefore, the oldest parameter set may be deleted from a memory device 103, 203, 303 and a new parameter set may be stored in the memory device 103, 203, 303, when the capacity of the memory device 103, 203, 303 is depleted.

To prevent the deletion of important parameter sets, a marking user input 315 regarding a respective parameter set may be provided by a user. The respective parameter set is then marked as permanent after receiving the marking user input 315. When deleting the oldest parameter set from the memory device 103, 203, 303 the parameter sets marked as permanent will be skipped.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300 test and measurement device
101, 201, 301 test controller
102, 202, 302 configuration parameters
103, 203, 303 memory device
104, 204, 304 test signals
205, 305 display device
206, 306 image
207, 307 measurement curve
208, 209 representation
210, 310 user input device
211, 311 user selection
312 tabbed interface
313 tab
314 new parameter set user input
315 marking user input
150, 250, 350 electronic device under test

The invention claimed is:

1. A test and measurement device for testing an electronic device under test, the test and measurement device comprising:
    a test controller controlling the test and measurement device to perform tests with the electronic device under test based on respective user provided configuration parameters,
    a memory device coupled to the test controller,
    wherein the test controller automatically stores for every test in the memory device parameter sets comprising the user provided configuration parameters,
    a display device displaying representations of the stored parameter sets, and
    a tabbed interface that is displayed on the display device,
    wherein every tab of the tabbed interface comprises one of the representations of the stored user provided parameter sets;
    said test controller further storing an image representing the parameter sets of user provided configuration parameters,
    wherein said image comprising at least one of a measurement curve recorded during the test, and
    a screen shot of a complete content of the display device as shown during the test.

2. The test and measurement device according to claim 1, comprising a user input device that receiving a user selection of one of the displayed representations,
    wherein the test controller loads a respective set of user provided configuration parameters based on the user selection.

3. The test and measurement device according to claim 1, wherein the test controller storing measurement results of a measurement together with the respective parameter set and dynamically generating the representation of the respective parameter set based on the measurement results.

4. The test and measurement device according to claim 1, wherein when a tab is selected the test controller is configured to automatically load the respective parameter set and configure the test and measurement device according to the loaded parameter set.

5. The test and measurement device according to claim 1, wherein the tabbed interface comprises in the every tab a fully operational display of the test and measurement device.

6. The test and measurement device according to claim 1, comprising a new parameter set user input, wherein the test controller is configured to create a new parameter set after the new parameter set input is selected and store any parameter that is set by a user in a new parameter set.

7. The test and measurement device according to claim 1, wherein the test controller is configured to delete an oldest parameter set from the memory device and store a new parameter set in the memory device, when the capacity of the memory device is depleted.

8. The test and measurement device according to claim 7, comprising a marking user input configured to receive a user input regarding a respective parameter set, wherein the test controller is configured to mark the respective parameter set as permanent after receiving the user input and when deleting the oldest parameter set from the memory device skipping the parameter sets marked as permanent.

9. An operating method for operating a test and measurement device, the method comprising:
    receiving user provided configuration parameters for tests with an electronic device under test,
    performing the tests with the electronic device under test based on the received user provided configuration parameters,
    automatically storing every test parameters set comprising the user provided configuration parameters, and an image representing the configuration parameters;
    displaying representations of the stored parameter sets, and
    displaying a tabbed interface,
    wherein every tab of the tabbed interface comprises one of the representations of the stored test parameter sets, and
    wherein said image comprising at least one of a measurement curve recoded during the test, and
    a screen shot of a complete content of the display device as shown during the test.

10. The operating method according to claim 9, further comprising
    receiving a user selection of one of the displayed representations, and
    loading a respective set of user provided configuration parameters based on the user selection.

11. The operating method according to claim 9, comprising storing measurement results of a measurement together with the respective parameter set and dynamically generating the representation of the respective parameter set based on the measurement results.

12. The operating method according to claim 9, wherein when a tab is selected the respective parameter set is automatically loaded and the test and measurement device is configured according to the loaded parameter set.

13. The operating method according to claim 9, wherein the tabbed interface comprises in the every tab a fully operational display of the test and measurement device.

14. The operating method according to claim 9, comprising creating a new parameter set after receiving a new parameter set input and storing any parameter that is set by a user in the newly created parameter set.

15. The operating method according to claim 9, wherein an oldest parameter set is deleted from a memory device and a new parameter set is stored in the memory device, when the capacity of the memory device is depleted.

16. The operating method according to claim 15, comprising receiving a marking user input regarding a respective parameter set, wherein the respective parameter set is marked as permanent after receiving the marking user input and when deleting the oldest parameter set from the memory device the parameter sets marked as permanent are skipped.

* * * * *